(12) United States Patent
Hemenway (10) Patent No.: US 10,651,355 B1
(45) Date of Patent: May 12, 2020

(54) HIGH-POWER LASER DIODE PACKAGE IMPLEMENTED WITH MENISCUS SLOW AXIS COLLIMATOR FOR REDUCED DIODE PACKAGE FOOTPRINT OR IMPROVED LASER OUTPUT BRIGHTNESS

(71) Applicant: nLIGHT, Inc., Vancouver, WA (US)

(72) Inventor: David Martin Hemenway, Beaverton, OR (US)

(73) Assignee: nLIGHT, Inc., Vancouver, WA (US)

(*) Notice: Subject to any disclaimer, the term of this patent is extended or adjusted under 35 U.S.C. 154(b) by 0 days.

(21) Appl. No.: 16/192,696

(22) Filed: Nov. 15, 2018

(51) Int. Cl.
| H01S 5/40 | (2006.01) |
| H01L 33/58 | (2010.01) |
| G02B 27/09 | (2006.01) |
| G02B 27/30 | (2006.01) |

(52) U.S. Cl.
CPC .......... *H01L 33/58* (2013.01); *G02B 27/0977* (2013.01); *G02B 27/30* (2013.01); *H01S 5/4012* (2013.01); *H01S 5/4075* (2013.01)

(58) Field of Classification Search
CPC .... H01S 5/4012; H01S 5/4025; H01S 5/4075; G02B 27/30
See application file for complete search history.

(56) References Cited

U.S. PATENT DOCUMENTS

| 4,609,262 A | 9/1986 | Fujikawa et al. |
| 5,251,060 A | 10/1993 | Uenishi et al. |
| 9,455,552 B1 * | 9/2016 | Price ................... H01S 5/02292 |
| 2007/0047401 A1 | 3/2007 | Sun |
| 2009/0323752 A1 | 12/2009 | Chuyanov et al. |
| 2014/0300971 A1 | 10/2014 | Wolak et al. |
| 2017/0051883 A1 | 2/2017 | Raring et al. |
| 2017/0170629 A1 | 6/2017 | Lerner et al. |
| 2017/0235057 A1 | 8/2017 | Hemenway et al. |
| 2018/0183214 A1 | 6/2018 | Dawson et al. |

FOREIGN PATENT DOCUMENTS

EP 0721113 A2 7/1996

OTHER PUBLICATIONS

International Search Report and Written Opinion for International Application No. PCT/US2018/062889, dated Aug. 8, 2019, 7 pages.

* cited by examiner

*Primary Examiner* — Michael Carter (57) ABSTRACT

A high-power laser diode assembly uses a greater number of emitters in a laser diode package or uses larger, wider laser diode emitters to produce higher-power laser output. Each assembly design option includes a meniscus slow axis collimator lens having a light entrance surface imparting strong negative lens surface power to diverge an incident beam outwards and a light exit surface imparting even stronger positive lens surface power to collimate the rapidly diverging beam. In one example, a 5 mm focal length meniscus collimator lens, as compared to a standard 12 mm focal length collimator lens, can reduce by 7 mm the physical path from the collimator lens to the laser diode. In another example, a 15 mm focal length meniscus collimator lens with the same back focal length as that of a standard 12 mm collimator facilitates increasing chip-on-submount width from 200 μm to 250 μm.

9 Claims, 7 Drawing Sheets

HIGH-POWER LASER DIODE PACKAGE IMPLEMENTED WITH MENISCUS SLOW AXIS COLLIMATOR FOR REDUCED DIODE PACKAGE FOOTPRINT OR IMPROVED LASER OUTPUT BRIGHTNESS

COPYRIGHT NOTICE

© 2018 nLIGHT, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

TECHNICAL FIELD

This disclosure relates to a packaged high-power laser diode assembly that includes multiple laser diodes, each of which formed with a meniscus lens within a slow axis collimator to produce high-power output from a laser diode assembly configured for inclusion in a modular package that exhibits reduced overall physical footprint or improved laser output brightness.

BACKGROUND INFORMATION

Multimode laser diodes are also known as broad area lasers (BALs). Broad area laser diodes are edge-emitting laser diodes in which the emitting region has a strongly asymmetric shape in the form of a broad stripe. State of the art high-power laser diode packages collimate broad area lasers using a fast axis collimator and a slow axis collimator. These laser diode packages use fast axis collimator lenses having focal lengths on the order of 0.15 mm-5 mm, with higher performance packages having shorter fast axis collimator lens focal lengths, such as for example, a 0.32 mm focal length. Additionally, most laser diode packages use a plano-convex slow axis collimator lens having a focal length of between 5 mm and 15 mm, which is dictated by the slow-axis brightness of the laser diode. Conservation of etendue drives the residual divergence of the collimated beam, and minimizing overall package footprint of the laser diode package is a longstanding objective.

Generally, as the broad area laser increases in width, for example, from a 95 µm emitter to a 250 µm emitter, the reduced brightness of the wider emitter dictates more asymmetry in the optical system. Minimizing the asymmetry may be accomplished by increasing the focal length of the slow axis collimator, but doing so would negatively affect the overall physical footprint of the laser diode package. Current trends are, however, to reduce the size/volume/mass of the laser diode package, not to increase it. A simplified example is one in which the slow axis focal length in currently available packages occupies about 20 mm of the available overall package width of approximately 70 mm (i.e., about 28%). Devising a method to reduce the focal length of the slow axis collimator, and therefore its back focal length, would result in reduction of the package footprint/volume/mass.

SUMMARY OF THE DISCLOSURE

The disclosed high-power laser diode package enables use of a greater number of emitters in a given package volume. Moreover, the disclosed laser diode package enables use of larger, wider laser diode emitters in the production of higher-power laser output. Each of these system design options is accomplished by a slow axis collimator lens design in which the light entrance surface facing the laser diode has a strong negative lens surface power to diverge the beam outwards, and the light exit surface has an even stronger positive lens surface power to collimate the rapidly diverging beam.

As a first example, creating a 5 mm focal length slow axis collimator lens, as compared to a standard 12 mm focal length slow axis collimator lens, can reduce by 7 mm the physical path from the exit surface of the slow axis collimator lens to the emitting face of the laser diode and thereby reduce the size of the laser diode package.

As a second example, creating a 15 mm focal length slow axis collimator lens, but with the same back focal length as that of a standard 12 mm focal length slow axis collimator lens, facilitates increasing from 200 µm to 250 µm a chip-on-submount width without negatively impacting the assembly level numerical aperture or increasing the size of the laser diode package because of the decreased residual divergence afforded by the 15 mm focal length slow axis collimator lens.

Additional aspects and advantages will be apparent from the following detailed description of preferred embodiments, which proceeds with reference to the accompanying drawings.

DETAILED DESCRIPTION OF PREFERRED EMBODIMENTS

Figure 1A:
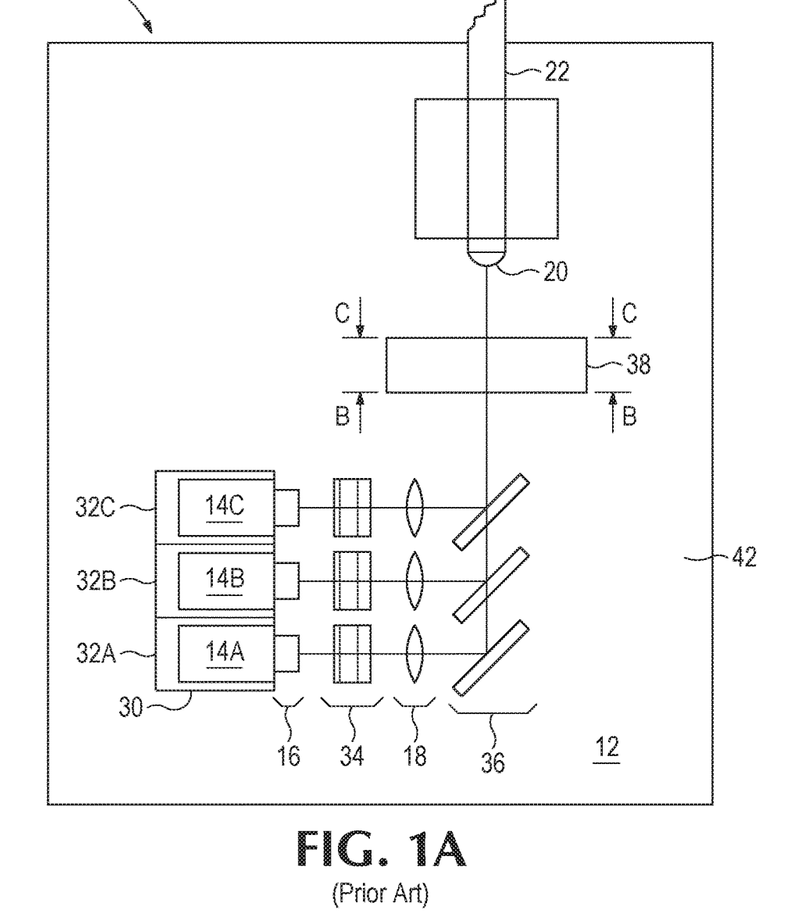
FIG. 1A shows the optical component layout of a conventional high-power laser diode package.
Figure 1B:
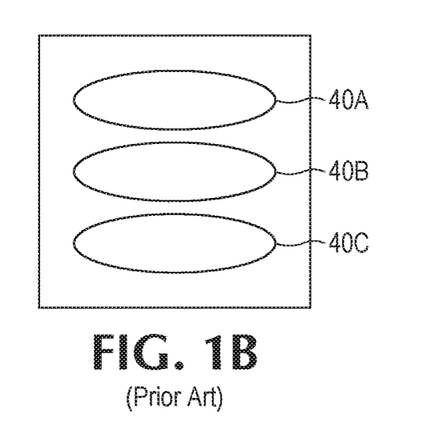
FIGS. 1B and 1C show stacks of respective input laser beams and compressed laser beams produced by the laser diode package of FIG. 1A.
Figure 1C:
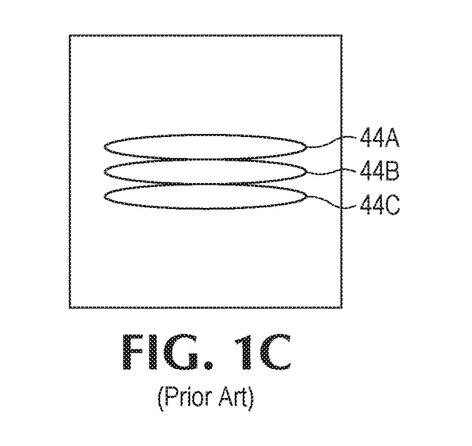

FIGS. 1A, 1B, and 1C show the optical component layout of, and stacks of laser beams produced by, a conventional high-power laser diode package using fast axis collimation optics and slow axis collimation optics to collimate radiation emitted by broad area lasers.

FIG. 1A shows, as an example, a packaged laser diode assembly 10 included in a laser diode package housing 12. Laser diode assembly 10 includes three broad area laser diodes 14A, 14B, and 14C emitting laser beams that are collimated by fast axis collimation optics 16 and slow axis collimation optics 18. The collimated beams are directed to an objective lens 20, which delivers them to an optical fiber 22.

Housing 12 is shown partly removed for convenient illustration. A stepped surface 30 includes multiple stepped surface portions 32A, 32B, and 32C to which one or more laser diodes 14A, 14B, and 14C, respectively, are secured so as to be positioned typically at different monotonically descending or ascending heights. A single laser diode is typically mounted on each step, and the laser diodes are secured to the steps so that laser radiation propagates along substantially parallel axes. Deviations from a parallel arrangement can be compensated as needed, as will be discussed below.

Fast axes of laser diodes 14A, 14B, and 14C are perpendicular to the plane of the figure, and slow axes are in the plane of the figure. The emitted beams from laser diodes 14A, 14B, and 14C are received and collimated by fast axis collimation optics 16 and slow axis collimation optics 18 to produce collimated beams. Optional volume Bragg grating elements 34 can be positioned between fast axis collimation optics 16 and slow axis collimation optics 18 to provide locking of the wavelengths of laser diodes 14A, 14B, and 14C.

Light reflecting elements or turning mirrors 36 receive the collimated beams, which propagate generally parallel to one another after collimation. In the example of FIG. 1A, turning mirrors 36 are positioned to reflect the collimated beams at right angles so that the reflected beams are directed to a beam compressor 38. A preferred beam compressor is described in Pub. No. US 2017/0235057, a publication of U.S. patent application Ser. No. 15/435,117, which is assigned to the assignee of this patent application. The propagation direction of the beam emitted from each of laser diodes 14A, 14B, and 14C can be adjusted by a corresponding adjustment of the corresponding one of reflectors 36. At beam compressor 38, the fast axes of the reflected beams are stacked one above the other to form stacked beams 40A, 40B, and 40C (shown in FIG. 1B) corresponding to laser diodes 14A, 14B, and 14C, respectively, and having separations based on the heights of stepped surface portions 32A, 32B, and 32C. Turning mirrors 36 and slow axis collimation optics 18 can be conveniently secured to a common surface 42.

A top-most portion of each turning mirror 36 for each collimated beam is set at a height so that the reflected beams are not clipped by downstream turning mirrors 36. For example, in FIG. 1A, a bottom-most mirror in the drawing has the largest height to correspond to a largest step height of the corresponding stepped surface portion 32A. A spacing between adjacent ones of stacked beams 40A, 40B, and 40C is adjusted by beam compressor 38, and then the compressed beams are directed to objective lens 20, which directs the compressed beams into optical fiber 22. In some examples, objective lens 20 is a single plano-convex lens, and in other examples, more complex multi-element lenses are used, including spherical and aspherical surfaces.

As shown in FIGS. 1B and 1C, an input beam stack of beams 40A, 40B, and 40C propagates from beam compressor 38 as a compressed beam stack of beams 44A, 44B, and 44C. Comparison of FIGS. 1B and 1C reveals that beam separation, along with beam diameter, is compressed in the direction of compression.

Figure 2A:
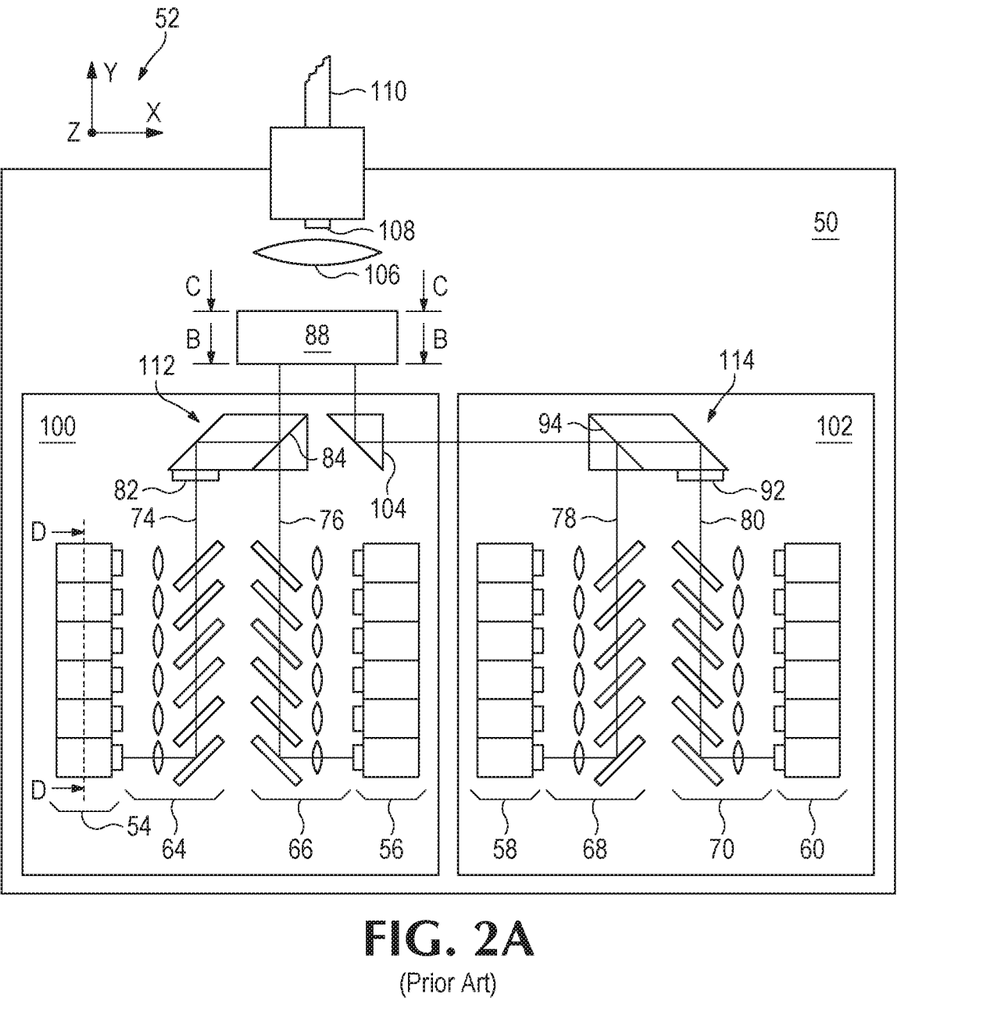
FIG. 2A shows a high-power laser diode assembly in which two beam stacks are formed using polarization multiplexing and are compressed by a beam compressor.
Figure 2B:
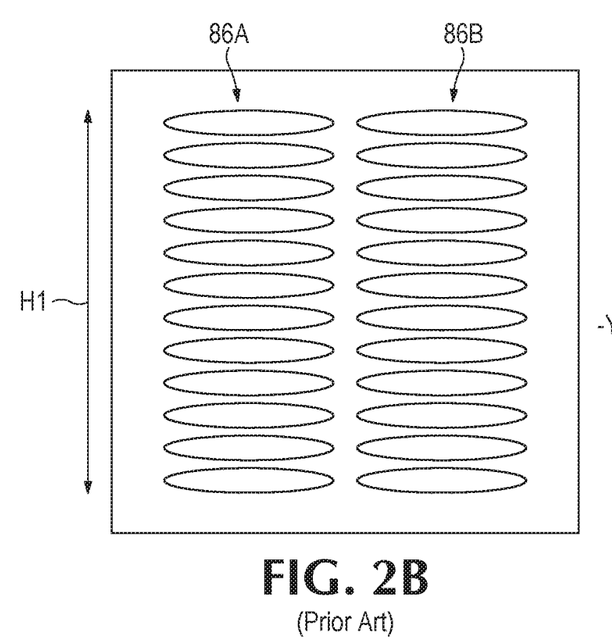
FIGS. 2B and 2C show the beam stacks of FIG. 2A before and after compression, respectively.
Figure 2C:
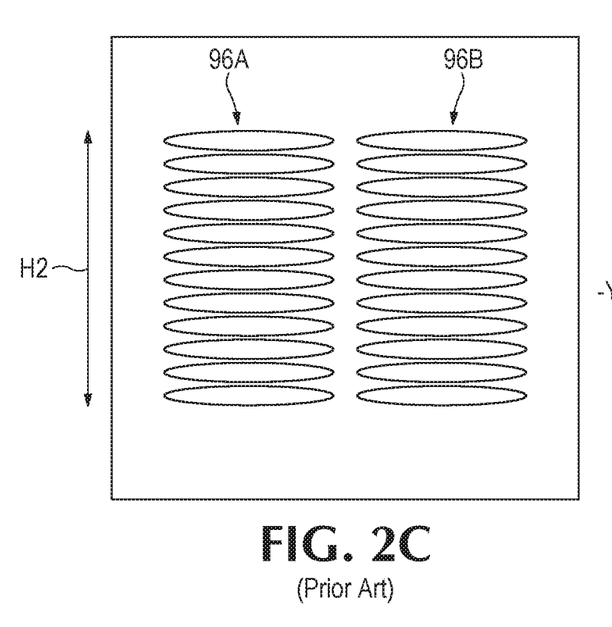
Figure 2D:
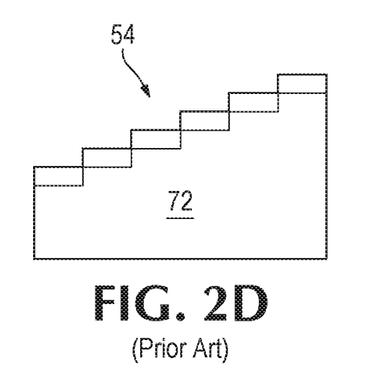
FIG. 2D shows a representative stair-step laser diode mount for a set of laser diodes that are used in the formation of the two beam stacks of FIG. 2A.

FIGS. 2A, 2B, 2C, and 2D show a laser diode assembly 50, which is described with reference to a right-handed xyz coordinate system 52, the z-axis extending upwardly out of the plane of FIG. 2A. Laser diode assembly 50 includes sets 54, 56, 58, and 60 of laser diodes that are arranged to emit respective sets of laser beams to corresponding sets 64, 66, 68, and 70 of reflectors and fast and slow axis collimators. For example, the laser diodes of set 54 emit beams along an x-axis direction, which are then redirected by respective reflectors of set 64 so as to propagate along a y-axis direction. The laser diodes of each set are displaced or offset from one another along a z-axis, and the associated reflectors are positioned so that laser beams from the set are not blocked by the reflectors. As shown in FIG. 2D, set 54 of laser diodes is secured to a stepped mount 72 to provide suitable z-axis offsets. Similar mounts are provided for the remaining sets of laser diodes. For convenience, beam propagation axes 74, 76, 78, and 80 are shown for the bottom-most laser diodes of each set. Beam propagation axes for the remaining laser diodes of each set are similar to one another but are displaced along the z-axis.

The laser beams from set 54 of laser diodes are directed by reflectors of set 64 to a half-wave retarder 82 and then combined with the laser beams from set 56 of laser diodes, as redirected by reflectors of set 66, at a polarizing beam splitter 84 so that a vertically stacked set 86A of beams (shown in FIG. 2B) is incident on a beam compressor 88. The laser beams from set 60 of laser diodes are directed by reflectors of set 70 to a half-wave retarder 92 and then combined with the laser beams from set 58 of laser diodes, as redirected by reflectors of set 68, at a polarizing beam splitter 94 so that a vertically stacked set of beams 86B (shown in FIG. 2B) is incident on beam compressor 88.

A mounting surface 100 and a mounting surface 102 are provided for, respectively, laser diodes 54 and 56 and laser diodes 56 and 60. Uncompressed laser beams from laser diodes 58 and 60 are directed by a prism 104 to beam compressor 88. An objective lens 106 directs the compressed beams to an input surface 108 of an optical fiber 110. Polarizing beam splitters 84 and 94 can be included in respective optical assemblies 112 and 114, which can include prisms that redirect the combined beams.

FIG. 2B illustrates stacked beams 86A and 86B as incident on beam compressor 88. FIG. 2C illustrates vertically stacked sets 96A and 96B of beams exiting beam compressor 88, in which beam spacing and individual beam height are altered by a compression ratio $M=H_2/H_1$. In this example, a cylindrical beam compressor applies compression in a z-direction but not in an x-direction. Additional beam compressors can be provided for compression in other directions, or a beam compressor using spherical surfaces can be used.

Figure 3A:
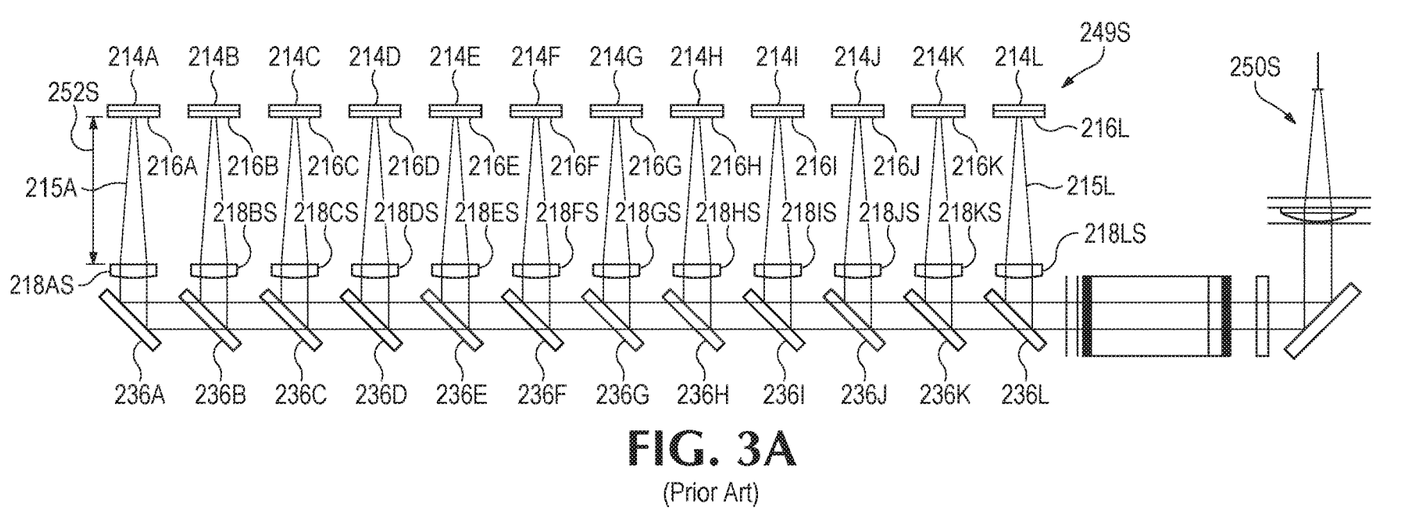
FIGS. 3A, 3B, and 3C are top plan view diagrams showing in successive incremental steps the beneficial effect on the overall footprint of a laser diode package achieved by use of a meniscus slow axis collimator lens in accordance with the disclosure.
Figure 3B:
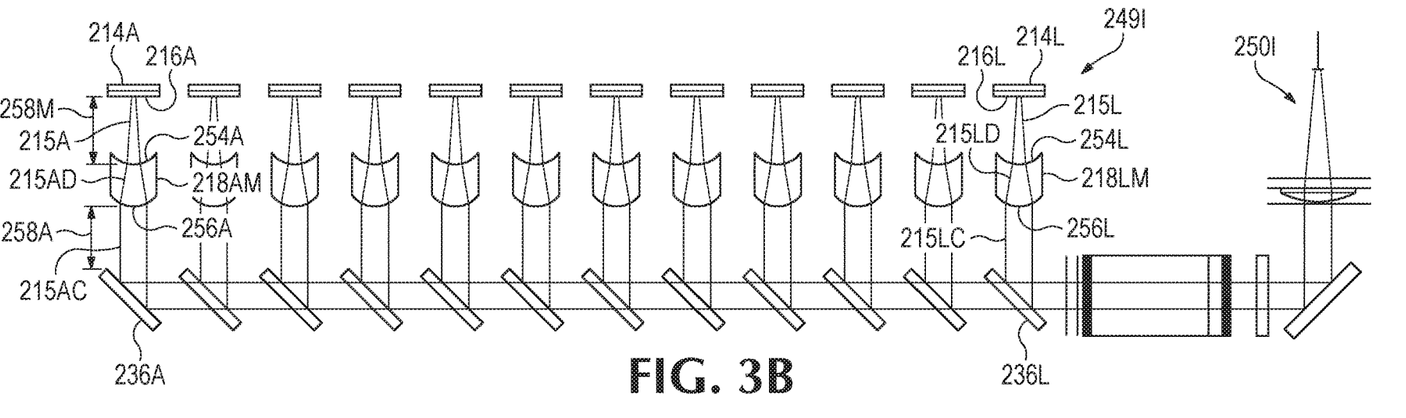
Figure 3C:
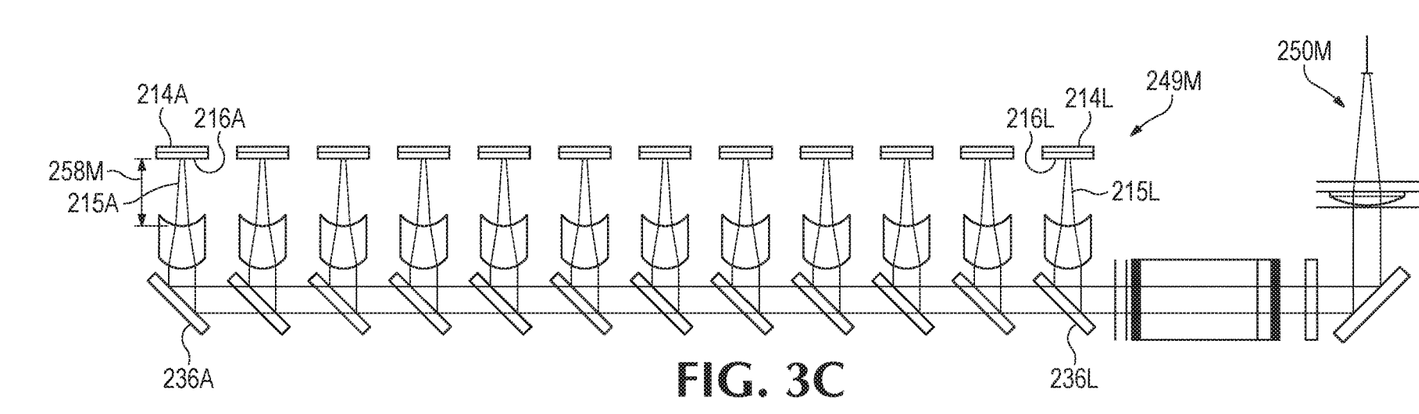

FIGS. 3A, 3B, and 3C (collectively, FIG. 3) are top plan view diagrams that show, in successive incremental steps, the beneficial effect on the overall footprint of a laser diode package achieved by positioning a meniscus slow axis collimator lens between a broad area laser diode and a turning mirror. FIG. 3 shows a set of twelve substantially same broad area laser diodes 214A, . . . , 214L mounted on respective stepped surface portions (not shown) so that respective laser beams 215A, . . . , 215L propagate along substantially parallel axes. Laser beams 215A, . . . , 215L are, respectively, collimated by fast axis collimation optics 216A, . . . , 216L and slow axis collimation optics 218AS, . . . , 218LS before incidence on turning mirrors 236A, . . . , 236L. Since the twelve laser diodes 214A, . . . , 214L are substantially the same, the following description is directed only to laser diode 214A but is applicable to laser diodes 214B, . . . , 214L.

FIG. 3A shows a conventional laser diode package 249S that occupies a nominal volume in a laser diode assembly 250S. A diverging laser beam 215A propagating from laser diode 214A is collimated by a standard plano-convex slow axis collimator lens 218AS, which has a 12 mm nominal back focal length 252S. Nominal back focal length 252S includes the space occupied by fast axis collimation optics 216A. Slow axis collimator lenses 218AS, . . . , 218LS each have the same nominal back focal length 252S.

FIG. 3B shows a laser diode package 249I that is implemented with different slow axis collimation optics from that shown in FIG. 3A but occupies the nominal volume in a laser diode assembly 250I. Diverging laser beam 215A is received and collimated by a meniscus slow axis collimator lens 218AM, which has a first or light entrance surface 254A and a second or light exit surface 256A. Light entrance surface 254A imparts negative lens surface power to diverge laser beam 215A outwardly at a rate that is greater than the relatively slow initial rate of divergence of laser beam 215A to form a rapidly diverging laser beam 215AD. Light exit surface 256A imparts to rapidly diverging laser beam 215AD positive surface power that is stronger than the negative lens surface power to collimate rapidly diverging laser beam 215AD and thereby form a collimated laser beam 215AC. Meniscus slow axis collimator lens 218AM has a 5 mm back focal length 252M. FIG. 3B shows that the placement of meniscus slow axis collimator lens 218AM creates a dead space 258A through which collimated laser beam 215AC propagates between light exit surface 256A and turning mirror 236A.

FIG. 3C shows in a laser diode assembly 250M a laser diode package 249M that has the 5 mm back focal length 252M and is more compact in the absence of dead space 258A between light exit surface 256A of meniscus slow axis collimator lens 218AM and turning mirror 236A of FIG. 3B. The reduction in overall footprint of the laser diode package is 7 mm. The volume occupied by laser diode package 249M is, therefore, less than the nominal volume occupied by laser diode package 249S.

Figure 4:
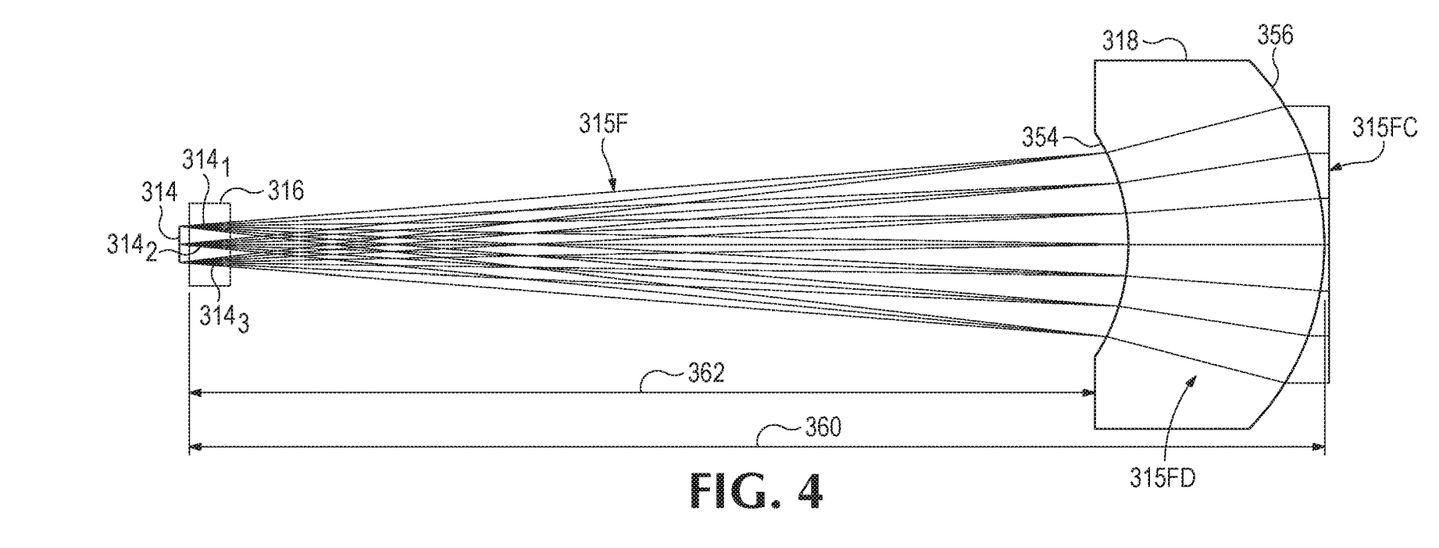
FIG. 4 is a sequential ray trace diagram that facilitates description of the beneficial effect of use of a meniscus slow axis collimator lens together with a single broad area laser diode optically associated with a single chip-on-submount (COS).

FIG. 4 is a sequential ray trace diagram presented to facilitate description of the beneficial effect of positioning a meniscus slow axis collimator lens together with a single broad area laser diode 314 optically associated with a single chip-on-submount (COS). This embodiment creates a longer focal length slow axis collimator lens with the same back focal length as the nominal back focal length of standard plano-convex slow axis collimator lens 218AS of FIG. 3A. When each of multiple broad area diodes is mounted on and defines a width of the submount in the laser diode package, the resulting benefit is less residual divergence than the characteristic residual divergence of collimator lens 218AS and a consequent improved assembly level numerical aperture (i.e., brightness) without increasing the submount width relative to the nominal focal length.

The ray trace diagram of FIG. 4 shows laser diode 314 emitting three sets of light rays $314_1$, $314_2$, and $314_3$ represented by a light field 315F in FIG. 4. The three sets of light rays $314_1$, $314_2$, and $314_3$ represent, respectively, light rays emitted from one edge, the middle, and the other edge of the laser diode 314, as exhibited in the ray trace produced by the Zemax optical design program. Light rays $314_1$, $314_2$, and $314_3$ propagate through a fast axis collimator lens 316 and are incident on a meniscus slow axis collimator lens 318, which has a first or light entrance surface 354 and a second or light exit surface 356. Light entrance surface 354 imparts negative lens surface power to diverge the light rays of light field 315F outwardly at a rate that is greater than the relatively slow initial rate of divergence to form rapidly diverging light rays of a light field 315FD propagating within meniscus slow axis collimator lens 318. Light exit surface 356 imparts to the rapidly diverging light rays of light field 315FD positive lens surface power that is stronger than the negative lens surface power to collimate the rapidly diverging light rays of light field 315FD to form collimated light rays of a light field 315FC. The curvatures of light entrance surface 354 and light exit surface 356 are set to create meniscus slow axis collimator lens 318, with, for example, a 15 mm focal length 360 but a 12 mm back focal length 362 that is the same as back focal length 252S shown in FIG. 3A. Because their radii of curvature are small, light entrance surface 354 and light exit surface 356 exhibit aspheric lens surface profiles. The width of laser diode 314 can, therefore, be increased, for example, from 200 μm to 250 μm without negatively impacting the assembly level numerical aperture or increasing the footprint of the laser diode package.

Another beneficial effect can be achieved for multiple broad area laser diodes contained within a package and emitting laser beams that propagate along different path lengths for incidence on a meniscus slow axis collimator lens exhibiting slow axis residual divergence. The meniscus slow axis collimator lens designed to have a meniscus lens focal length that is longer than the nominal focal length and a meniscus lens back focal length that is substantially the same as the nominal back focal length provides slow axis residual divergence that is less than the characteristic slow axis residual divergence of standard plano-convex slow axis collimator lens 218AS and a consequent reduction in numerical aperture and increase in brightness.

The meniscus slow axis collimator lenses of the embodiments described above are each a transmissive optical substrate preferably made of glass of a type that is operationally compatible with the beam wavelength and power and has a center glass thickness of a value that minimizes residual divergence of the collimated rapidly diverging beam.

The following examples present optical design criteria for laser diode package embodiments in which a meniscus collimator lens is a substitute for a standard 12 mm plano-convex focal length slow axis collimator. Example 1 is an implementation in which the substitute meniscus slow axis collimator lens maintains the 12 mm nominal focal length, but shortens the back focal length, of the standard plano-convex slow axis collimator lens. Example 2 is an implementation in which the substitute meniscus slow axis collimator lens maintains the physical path length but provides a longer focal length than the 12 mm nominal focal length of the standard plano-convex slow axis collimator lens.

Figure 5:
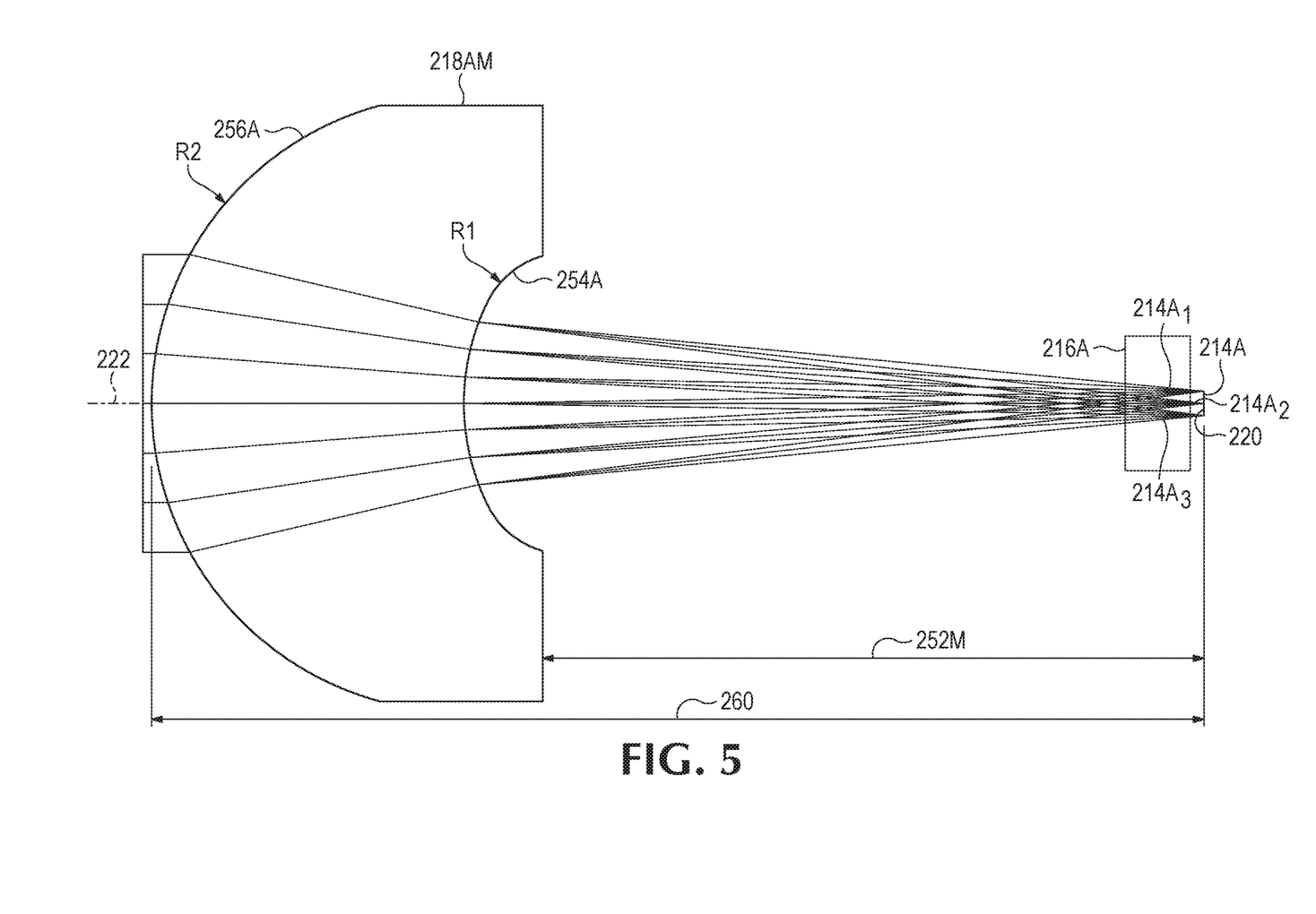
FIG. 5 is a plan view layout of optical components in an implementation in which a substitute meniscus slow axis collimator lens maintains the nominal focal length, but shortens the back focal length, of a standard plano-convex slow axis collimator lens.

Example 1 presents meniscus slow axis collimator lens design criteria for a laser diode package implemented with a laser diode exhibiting a 125 μm slow-axis near field and a 9 mm focal length. FIG. 5 is a plan view layout of optical components including laser diode 214A, fast axis collimation optics 216A, and meniscus slow axis collimator lens 218AM of laser diode package 250M, which corresponds to that of FIG. 3C. FIG. 5 shows laser diode 214A having an emission face 200 and a centerline 222. Top of field light rays $214A_1$ are emitted +62.5 μm from centerline 222, middle of field light rays $214A_2$ are emitted on centerline 222, and bottom of field light rays $214A_3$ are emitted—62.5 μm from centerline 222 of emission face 220. Meniscus slow axis collimator lens 218AM is formed with even aspheric surfaces, in which light entrance surface 254A has R1=1.49 mm and light exit surface 256A has R2=2.0 mm. There are multiple solutions for the even aspheric coefficients; therefore, for the Example 1 implementation, the values of the conic coefficients, K, for surfaces 256A and 254A are—1<K<0 (i.e., prolate elliptical). Meniscus slow axis collimator lens 218AM is made of 1.79 high index glass specified at 976 nm and has a 2.1 mm center thickness.

The laser diode package embodiment implemented with the above-specified laser diode 214A and meniscus slow axis collimator lens 218AM exhibits a 5.1 mm back focal length 252M (including the glass of fast axis collimation optics 216A). This results in a 7.2 mm (5.1 mm+2.1 mm) total physical path length 260 from light exit surface 256A of meniscus slow axis collimator lens 218AM to emitting face 220 of laser diode 214A and represents a 25% ((12 mm−9 mm)/12 mm) shorter focal length relative to the 12 mm nominal focal length, without degrading beam quality.

Conservation of brightness (etendue) means that residual divergence of a multi-mode laser diode is increased by 25%. However, the "smaller" (125 μm) slow-axis near field develops a brighter laser diode, as compared to the 250 μm laser diode in Example 2 below, so the overall residual divergence is nominally conserved from that of the 12 mm focal length standard plano-convex slow axis collimator. The overall result is enablement of smaller, more compact laser diode packages for high brightness applications in which overall mass and volume are a consideration.

Figure 6:
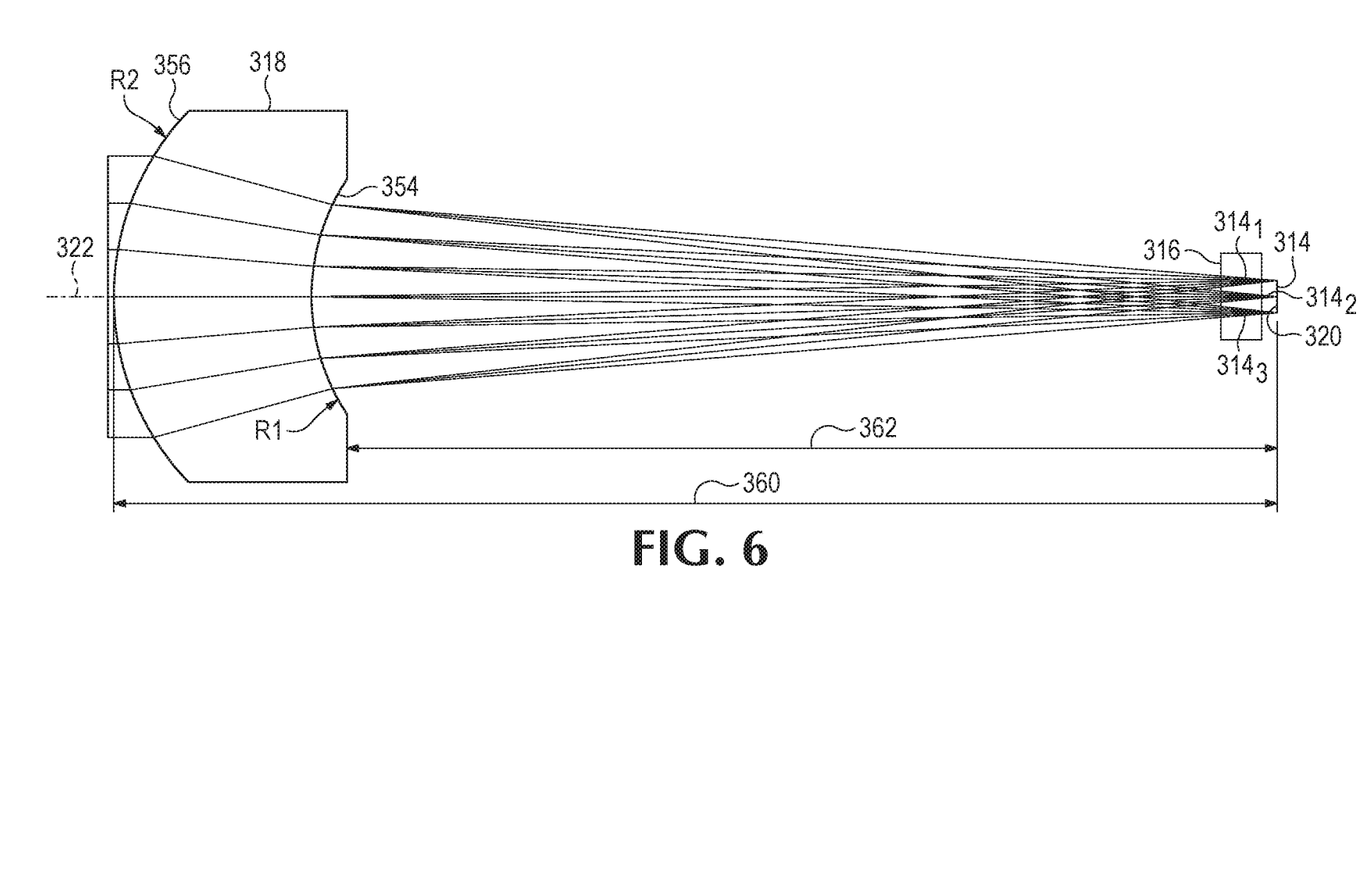
FIG. 6 is a plan view layout of optical components in an implementation in which a substitute meniscus slow axis collimator lens maintains the physical path length but provides a longer focal length than the nominal focal length of a standard plano-convex slow axis collimator lens.

Example 2 presents meniscus slow axis collimator lens design criteria for a laser diode package implemented with a laser diode exhibiting a 250 μm slow-axis near field and a 15 mm focal length. FIG. 6 is a plan view layout of optical components including laser diode 314, fast axis collimation optics 316, and meniscus slow axis collimator lens 318, which corresponds to that of FIG. 4. FIG. 6 shows laser diode 314 having an emission face 320 and a centerline 322. Top of field light rays $314_1$ are emitted +125 μm from centerline 322, middle of field light rays $314_2$ are emitted on centerline 322, and bottom of field light rays $314_3$ are emitted—125 μm from centerline 322 of emission face 320. Meniscus slow axis collimator lens 318 is formed with even aspheric surfaces, in which light entrance surface 354 has R1=2.59 mm and light exit surface 356 has R2=2.9 mm. There are multiple solutions for the even aspheric coefficients; therefore, for the Example 2 implementation, the values of the conic coefficients, K, for surfaces 356 and 354 are K>0 (i.e., oblate elliptical). Meniscus slow axis collimator lens 318 is made of 1.79 high index glass specified at 976 nm and has a 2.14 mm center thickness.

The laser diode package embodiment implemented with the above-specified laser diode 314 and meniscus slow axis collimator lens 318 exhibits a 10.4 mm back focal length 362 (including the glass of fast axis collimation optics 316). This results in a 12.5 mm (10.4 mm+2.14 mm) total physical path length 360 from light exit surface 356 of meniscus slow axis collimator lens 318 to emitting face 320 of laser diode 314 and represents a 25% (15 mm/12 mm) longer focal length relative to the 12 mm nominal focal length without increasing the physical path length.

Conservation of brightness (etendue) means that residual divergence of a multi-mode laser diode is decreased by 25%. The result is enablement of designing additional emitters into the laser diode package because the additional emitters will have a longer path length.

It will be obvious to those having skill in the art that many changes may be made to the details of the above-described embodiments without departing from the underlying principles of the invention. For example, the disclosed laser diode assembly can be constructed using a recently introduced class of broad area diodes called reduced-mode (REM) diodes described in U.S. Pat. No. 9,166,369, which is assigned to the assignee of this patent application. REM diodes are broad area semiconductor diode laser devices having a flared current injection region extending between a multi-mode high reflector facet and a partial reflector facet. REM-diodes suppress higher-order modes and thereby enable use of larger emitters to scale power without compromising slow-axis brightness. The scope of the present invention should, therefore, be determined only by the following claims.

The invention claimed is:

1. In a laser diode assembly including multiple broad area laser diodes configured to emit multiple laser beams for propagation along separate beam axes that are mutually spaced apart from and parallel to one another, each of the laser diodes exhibiting a fast rate of divergence in a fast axis direction and a slow rate of divergence in a slow axis direction, each of the multiple emitted laser beams received and collimated by fast axis collimation optics and slow axis collimation optics to form one of multiple collimated laser beams that are reflected by respective light reflecting elements for delivery to an objective lens, the slow axis collimation optics positioned a nominal distance from their respective light reflecting element and having a nominal focal length and a nominal back focal length, and the objective lens directing the multiple laser beams reflected by the light reflecting elements to an optical fiber, the improvement comprising:

a transmissive optical substrate having first and second surfaces separated along an optical axis and configured to form a meniscus slow axis collimator lens that functions as the slow axis collimation optics, the first surface positioned to receive one of the multiple emitted laser beams and having a first curvature that imparts negative lens surface power to diverge outwardly the received one of the multiple emitted laser beams, the received one of the multiple emitted laser beams diverging outwardly at a rate that is greater than the slow rate of divergence to form a rapidly diverging beam, and the second surface having a second curvature that imparts positive lens surface power that is stronger than the negative lens surface power to collimate the rapidly diverging beam.

2. The laser diode assembly of claim 1, in which the laser diode assembly occupies a nominal volume in a laser diode package, and in which the meniscus slow axis collimator lens has a meniscus lens focal length that is shorter than the nominal focal length and a meniscus lens back focal length that is shorter than the nominal back focal length, thereby enabling positioning of the slow axis collimation optics, from their light reflecting element, a distance that is shorter than the nominal distance and resulting in the laser diode assembly occupying, in the laser diode package, a volume that is less than the nominal volume.

3. The laser diode assembly of claim 1, in which the slow axis collimation optics exhibit a characteristic slow axis residual divergence, in which the multiple broad area laser diodes are contained within a package that results in different path lengths along which the laser beams propagate for incidence on the meniscus slow axis collimator lens, and in which the meniscus slow axis collimator lens has a meniscus lens focal length that is longer than the nominal focal length and has a meniscus lens back focal length that is substantially the same as the nominal back focal length to provide a slow axis residual divergence that is less than the characteristic slow axis residual divergence and a consequent reduction in numerical aperture and increase in brightness.

4. The laser diode assembly of claim 1, in which each of the multiple broad area laser diodes is mounted on and defines a width of a submount in a laser diode package and the slow axis collimation optics exhibit characteristic slow axis residual divergence, and in which the meniscus slow axis collimator lens has a meniscus lens focal length that is longer than the nominal focal length and has a meniscus lens back focal length that is substantially the same as the nominal back focal length to provide a reduced residual divergence and a consequent increase in brightness of laser emission from the laser diode package without increasing the submount width relative to the nominal focal length.

5. The laser diode assembly of claim 1, in which the meniscus slow axis collimator lens is a unitary optical system.

6. The laser diode assembly of claim 1, in which the first curvature has an aspheric surface profile and the second curvature has an aspheric surface profile.

7. The laser diode assembly of claim 1, in which the first curvature and the second curvature are associated with, respectively, a first radius of curvature and a second radius of curvature, the second radius of curvature being longer than the first radius of curvature.

8. The laser diode assembly of claim 1, in which the received one of the multiple emitted laser beams has a laser beam wavelength and power, and in which the transmissive optical substrate is glass of a type that is operationally compatible with the beam wavelength and power and has a center glass thickness of a value that minimizes residual divergence of the collimated rapidly diverging beam.

9. The laser diode assembly of claim 1, in which the multiple broad area laser diodes include reduced-mode (REM) diodes.

* * * * *